United States Patent
Yasumura

(10) Patent No.: US 10,268,037 B2
(45) Date of Patent: Apr. 23, 2019

(54) INTERDIGITATING VERTICAL DAMPERS FOR MEMS-BASED ACTUATORS

(71) Applicant: Google LLC, Mountain View, CA (US)

(72) Inventor: Kevin Y. Yasumura, Lafayette, CA (US)

(73) Assignee: Google LLC, Mountain View, CA (US)

(*) Notice: Subject to any disclaimer, the term of this patent is extended or adjusted under 35 U.S.C. 154(b) by 21 days.

(21) Appl. No.: 15/499,700

(22) Filed: Apr. 27, 2017

(65) Prior Publication Data

US 2018/0314057 A1 Nov. 1, 2018

(51) Int. Cl.
*G02B 26/08* (2006.01)
*B81B 3/00* (2006.01)
*G02B 6/35* (2006.01)

(52) U.S. Cl.
CPC ........ *G02B 26/0841* (2013.01); *B81B 3/0045* (2013.01); *G02B 6/352* (2013.01); *G02B 6/3518* (2013.01); *G02B 6/3556* (2013.01); *B81B 2201/042* (2013.01)

(58) Field of Classification Search
CPC ............ G02B 26/0841; G02B 26/0833; G02B 6/3518; G02B 6/352; G02B 6/3556; B81B 3/0045; B81B 2201/042
USPC ............................................. 359/221.2, 224.1
See application file for complete search history.

(56) References Cited

U.S. PATENT DOCUMENTS

| | | | |
|---|---|---|---|
| 6,392,220 B1 | 5/2002 | Slater et al. | |
| 6,744,173 B2 | 6/2004 | Behin et al. | |
| 8,274,722 B2 * | 9/2012 | Moidu | G02B 26/0841 359/224.1 |
| 2003/0218793 A1 * | 11/2003 | Soneda | G02B 26/0841 359/291 |

(Continued)

FOREIGN PATENT DOCUMENTS

EP 1479647 A2 11/2004
JP 2000147419 A 5/2000

OTHER PUBLICATIONS

International Search Report and Written Opinion dated May 7, 2018 in International (PCT) Application No. PCT/US2018/019740.

(Continued)

*Primary Examiner* — Euncha P Cherry
(74) *Attorney, Agent, or Firm* — McDermott Will & Emery LLP

(57) ABSTRACT

A microelectromechanical system (MEMS) mirror assembly includes a base substrate defining a cavity and a plurality of first features extending upwards from a bottom of the cavity. The MEMS mirror assembly includes a mirror substrate coupled to the base substrate and defining a MEMS actuator and a MEMS mirror platform. Actuation of the MEMS actuator moves the MEMS mirror platform from a first positional state to a second positional state. The MEMS mirror platform defines a plurality of second features on a side of the MEMS mirror platform facing the base substrate that are sized, shaped, and positioned such that the plurality of second features extend into spaces separating the plurality of first features when the mirror platform is in the second positional state. The MEMS mirror assembly includes a reflective material disposed on a side of the MEMS mirror platform facing away from the base substrate.

20 Claims, 14 Drawing Sheets

(56) References Cited

U.S. PATENT DOCUMENTS

| | | | |
|---|---|---|---|
| 2004/0184132 A1* | 9/2004 | Novotny | G02B 26/0841 |
| | | | 359/290 |
| 2007/0127146 A1* | 6/2007 | Moon | G02B 26/0833 |
| | | | 359/871 |
| 2010/0103494 A1 | 4/2010 | Moidu | |

OTHER PUBLICATIONS

Extended European Search Report dated Sep. 27, 2018 in European Patent Application No. 18160294.7 (9 pages).
Combined Search and Examination Report dated Aug. 24, 2018 in United Kingdom Patent Application No. 1803524.6 (6 pages).
Taiwanese Office Action dated Nov. 28, 2018 in Taiwanese Patent Application No. 107108985, and English translation thereof (27 pages).

* cited by examiner

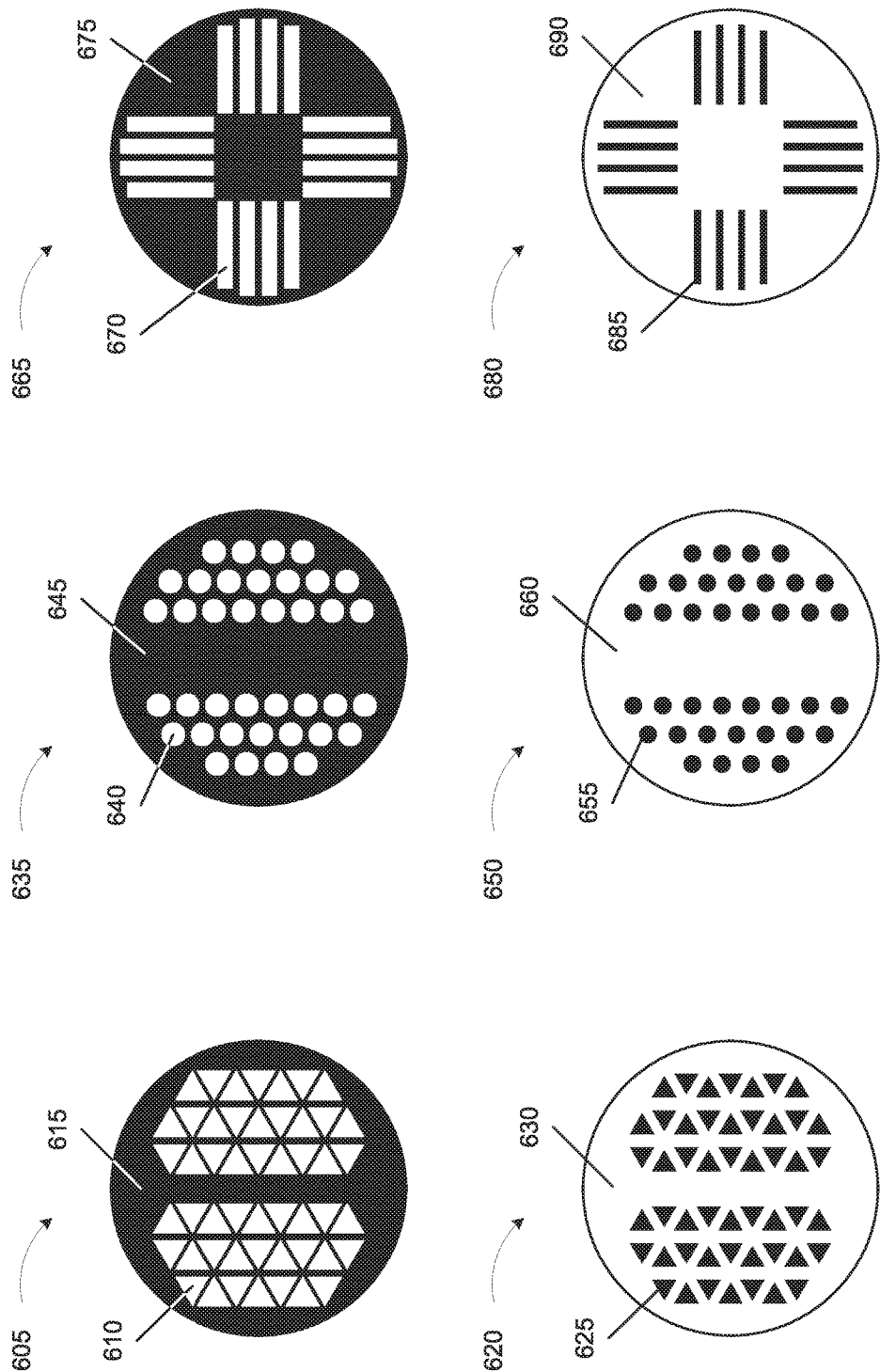

US 10,268,037 B2

INTERDIGITATING VERTICAL DAMPERS FOR MEMS-BASED ACTUATORS

BACKGROUND

Microelectromechanical systems (MEMS) mirrors have broad application in beam-steering devices. Application of voltage and/or current can control a position of the MEMS mirror, and thus steer a beam in a desired direction. When the mirror is repositioned, however, it may "ring" for a time before settling in its new position.

SUMMARY

At least one aspect is directed to a microelectromechanical system (MEMS) mirror assembly. The MEMS mirror assembly includes a base substrate defining a cavity and a plurality of first features extending upwards from a bottom of the cavity. The MEMS mirror assembly includes a mirror substrate coupled to the base substrate and defining a MEMS actuator and a MEMS mirror platform. Actuation of the MEMS actuator moves the MEMS mirror platform from a first positional state to a second positional state. The MEMS mirror platform defines a plurality of second features on a side of the MEMS mirror platform facing the base substrate that are sized, shaped, and positioned such that the plurality of second features extend into spaces separating the plurality of first features when the mirror platform is in the second positional state. The MEMS mirror assembly includes a reflective material disposed on a side of the MEMS mirror platform facing away from the base substrate.

At least one aspect is directed to a method of manufacturing a microelectromechanical system (MEMS) mirror array. The method includes providing a base substrate defining an array of cavities, each cavity having a plurality of first features extending upwards from a bottom of the cavity. The method includes providing a mirror substrate defining an array of MEMS actuators and MEMS mirror platforms. Each MEMS mirror platform defines a plurality of second features on a first side of the MEMS mirror platform that are sized, shaped, and positioned such that the plurality of second features can fit into spaces separating the plurality of first features extending up from a corresponding cavity in the base substrate. The method includes coupling the mirror substrate to the base substrate such that the first side of each MEMS mirror platform faces a corresponding cavity in the base substrate and activation of each MEMS actuator moves the corresponding MEMS mirror platform from a first positional state to a second positional state. The plurality of second features extend into spaces separating the plurality of first features in the second positional state. The method includes providing a reflective material disposed on a second side of each MEMS mirror platform opposite the first side of the MEMS mirror platform.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings:

FIGS. 6A-6C are diagrams of example mirror platform features and base substrate features, according to illustrative implementations;

DETAILED DESCRIPTION

Figure 1:
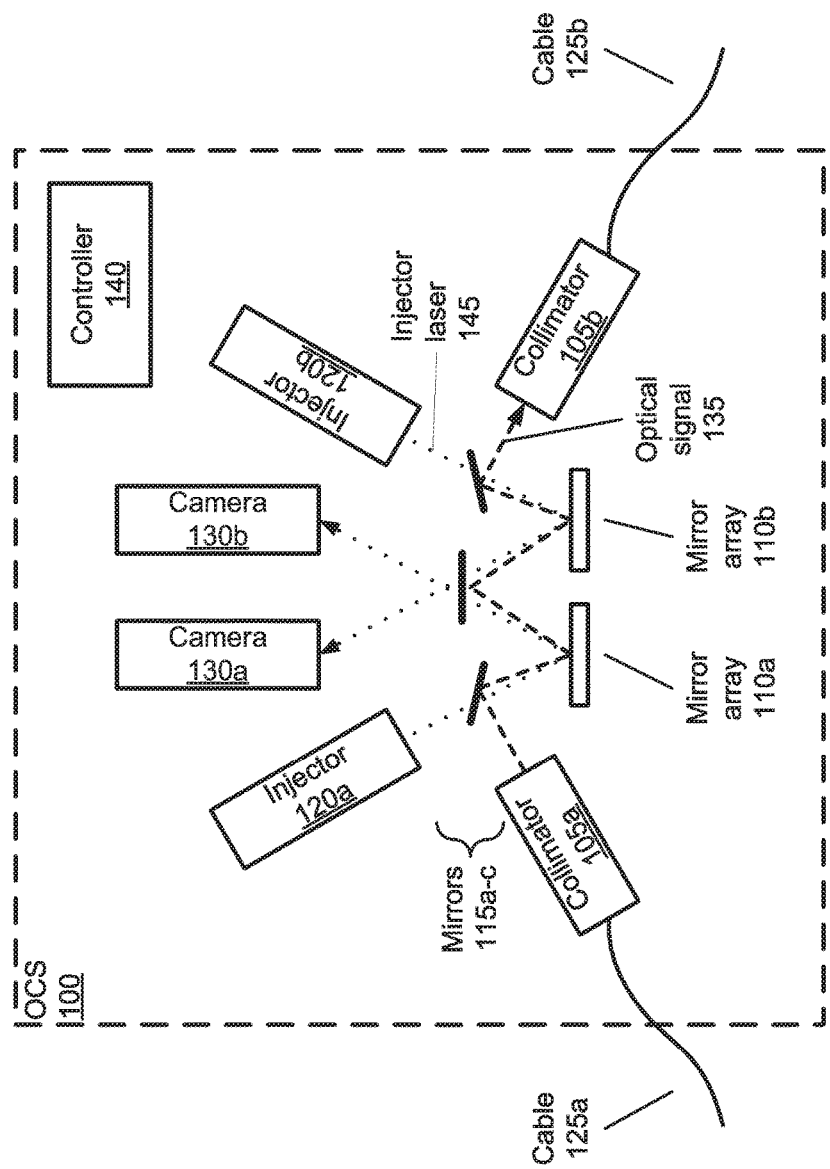
FIG. 1 is a block diagram of an optical circuit switch (OCS), according to an illustrative implementation.

This disclosure generally relates to dampers for microelectromechanical system (MEMS) mirrors used for beam steering. MEMS mirror beam steering is useful in, for example, an optical circuit switch (OCS). An OCS is an all-optical, 3D switching matrix that, in some implementations, can direct light from any input fiber N to any output fiber M by changing the positions of mirrors in two-dimensional MEMS mirror arrays. OCSs allow for switching in the optical domain without converting the optical signals to electrical signals and back again. This reduces latency, keeps traffic more secure, and makes the switch agnostic with regard to encoding and data rates.

A MEMS mirror in the OCS can route optical signals by rotating under the control of analog voltages applied to actuators coupled to the mirror. Mirror position is not binary, however, and the mirror will tend to "ring" following actuation for a period of time depending on the resonant frequency of the mirror and it supports, and the amount of mechanical and fluid damping around the actuator and mirror. During the period of ringing, the mirror may not be able to direct the optical signal to its intended destination. The ringing therefore results in a delay in switching during which the switch cannot transmit an optical signal across the ringing mirror. The amount of ringing depends on a quality factor (Q) of the device, with a high Q correlating to more ringing. A Q greater than 10 is typical for MEMS mirrors currently used in OCSs. By including a damper according to this disclosure, the Q can, in some implementations, be significantly reduced. In some cases the Q can be reduced by an order of magnitude. In some cases, the Q be brought below 10.

The MEMS mirrors can include a mirror platform over a base. The dampers can take the form of complementary features on the bottom of the mirror platform and the top of the base, respectively. These complementary features can interleave with each other such that fluid, such as dry air, is compressed in the gaps of one surface while the tines or pillars on the opposite surface move into the gaps. As the fluid pushes its way past the features to escape the gap, it produces a shear force along the edges of the features that is out of phase with the intended actuation direction, thereby producing a large damping force.

The complementary features can take various shapes according to the amount of damping desired. Certain shapes can provide additional benefits. For example, a close-packed structure of socket or cavity-like features etched into the underside of the mirror platform can reduce the mass of the mirror. The reduced mirror platform mass can increase the resonant frequency and the impact of the fluid damping mechanisms already present.

A significantly under-damped (high Q) MEMS mirror can ring for many cycles (10 s to 100 s) before settling enough to allow transmission of the optical signal. Adding dampers according to this disclosure can, in some implementations, reduce ringing to just a few cycles, allowing for faster switching. In addition, the dampers can reduce the mirror's sensitivity to movement caused by external excitation events such as shocks or vibration.

FIG. 1 is a block diagram of an optical circuit switch (OCS) 100, according to an illustrative implementation. In some implementations, the OCS 100 can route optical signals from any input fiber N to any output fiber M. The OCS 100 includes collimators 105a and 105b (collectively "collimators 105"), mirror arrays 110a and 110b (collectively "mirror arrays 110"), mirrors 115a-115c (collectively "mirrors 115"), injectors 120a and 120b (collectively "injectors 120"), and cameras 130a and 130b (collectively "cameras 130"). The OCS 100 can receive fiber optic cables 125a and 125b (collectively "fiber optic cables 125"). The functions of the OCS 100 can be controlled by a controller 140.

The OCS 100 can be a directionless switch, meaning that it can route optical signals in either direction between cable 125a and 125b, including bidirectional links where optical signals travel in both directions in an optical fiber. Descriptions of OCS 100 operation including directional language such as "input," "output," "enter," or "exit" are for illustrative purposes only and not intended to be limiting.

In an example operation, an optical signal 135 can enter the OCS 100 via a first fiber optic cable 125a. A first collimator 105a can receive the optical signal 135 from the first fiber optic cable 125a and direct it through a first mirror 115a to a first MEMS mirror array 110a. In some implementations, each mirror of the first MEMS mirror array 110a can correspond to a particular optical fiber of the first fiber optic cable 125a, and the first collimator 105a serves to direct the optical signal 135 from the optical fiber to the corresponding mirror of the first MEMS mirror array 110a.

The first MEMS mirror array 110a can direct the optical signal 135 off of a second mirror 115b to a second MEMS mirror array 110b. The second MEMS mirror array 110b can direct the optical signal 135 off of a third mirror 115c and into a second collimator 105b. The second collimator 105b can convey the optical signal to the second cable 125b.

The OCS 100 can include self-monitoring and self-diagnostic abilities. The OCS 100 can include injectors 120 and cameras 130 for monitoring the state of the mirror arrays 110. The injectors 120 can direct a laser 145 at the mirror arrays 110. The cameras 130 can receive the reflected laser 145 and determine the position of each mirror of the mirror arrays 110. The cameras 130 can detect whether a mirror is still ringing following a repositioning. Based on mirror state information from the injectors 120 and the cameras 130, the controller 140 can control optical signal routing. The controller 140 can maintain information regarding the state of each mirror and each signal path. The controller 140 can monitor for ringing mirrors, malfunctioning mirrors, or other signal path obstructions. The controller 140 can send alerts, including notifications to pause traffic on a particular optical fiber until the switching path is stable or until another switching path can be established.

Figure 2A:
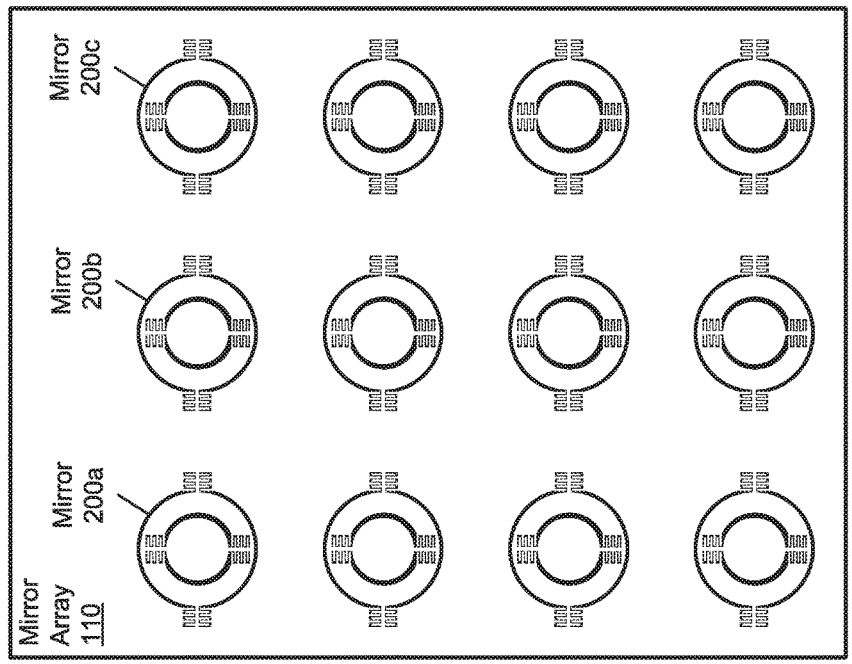
FIG. 2A is a diagram of a microelectromechanical system (MEMS) mirror, according to an illustrative implementation.

FIG. 2A is a diagram of a microelectromechanical system (MEMS) mirror assembly 200, according to an illustrative implementation. The MEMS mirror array 110 can include many MEMS mirror assemblies 200. The MEMS mirror assembly 200 includes three main components: a mirror platform 205, a gimbal 210, and a mirror substrate 215. The mirror platform 205, gimbal 210, and mirror substrate 215 are disposed above a base substrate (not shown). The mirror platform 205 includes a reflective surface on its upper side. The MEMS mirror assembly 200 includes actuators for moving the components. In the implementation shown in FIG. 2A, the MEMS mirror assembly 200 can be actuated in two dimensions. The actuators 220a and 220b (collectively "actuators 220") can move the mirror platform 205 with respect the gimbal 210, and the actuators 225a and 225b (collectively "actuators 225") can move the gimbal 210 and the mirror platform 205 with respect to the mirror substrate 215.

In some implementations, the actuators 220 and 225 can apply torque to their inner component. For example, the actuators 220 can apply torque to rotate the mirror platform 205 to cause rotation in the X-Z plane (i.e., about the Y-axis), and the actuators 225 can apply torque to rotate the gimbal 210 to cause rotation in the Y-Z plane (i.e., about the X-axis). In this manner, the actuators 220 and the actuators 225 can move the mirror platform 205 about a first axis and a second axis, respectively, where the axes are substantially orthogonal to each other. In some implementations, the actuators 220 and 225 can apply a vertical (Z-directed) force on its inner component. For example, the actuators 220 can rotate the mirror platform 205 in the Y-Z plane, and the actuators 225 can rotate the gimbal 210 in the X-Z plane. In these implementation, the mirror platform 205 can be positioned in two dimensions.

In some implementations, the actuators 220 and 225 can be vertical comb-drive electrostatic actuators. Each actuator 220 and 225 can have a first part and a second part; for example, the actuators 220 can have a left side and a right side, and the actuators 225 can have a top side and a bottom side, as oriented in the drawing. A first voltage applied to the first part of the actuator can cause the actuator to move the mirror platform 205 in a first direction. In some implementations, the first direction can be a rotational direction about an axis of motion of the mirror platform 205. A second voltage applied to the second part of the actuator can cause the actuator to move the mirror platform in a second direction opposite the first direction. For example, the first voltage may cause the mirror platform 205 to move clockwise around the axis, and the second voltage may cause the mirror platform 205 to move counterclockwise around the axis.

In some implementations, the actuators 220 and 225 and the movable components (i.e., the mirror platform 205 and the gimbal 210) of the MEMS mirror assembly 200 can behave as a spring-mass system. The MEMS mirror assembly 200 can have some intrinsic damping due to the material properties of the flexible mounts or beams supporting the movable components, and any fluid such as gas or liquid surrounding the movable components. The system may, however, be underdamped such that the movable components oscillate or ring after a perturbation such as a physical shock or vibration, or a repositioning of the mirror platform 205 in normal operation. This unwanted movement of the mirror platform 205 can render the MEMS mirror assembly 200 unusable for directing an optical signal until the movement subsides and the mirror platform 205 achieves an equilibrium. Therefore, it may be beneficial to increase damping of the system until it is closer to critically damped, such that the mirror platform 205 only oscillates for a few cycles before reaching equilibrium. In some implementations, the MEMS mirror assembly 200 can be critically damped or overdamped. Implementation of dampers for damping the MEMS mirror assembly 200 are described in more detail below with respect to FIGS. 3-5 and FIGS. 6A-6C.

Figure 2B:
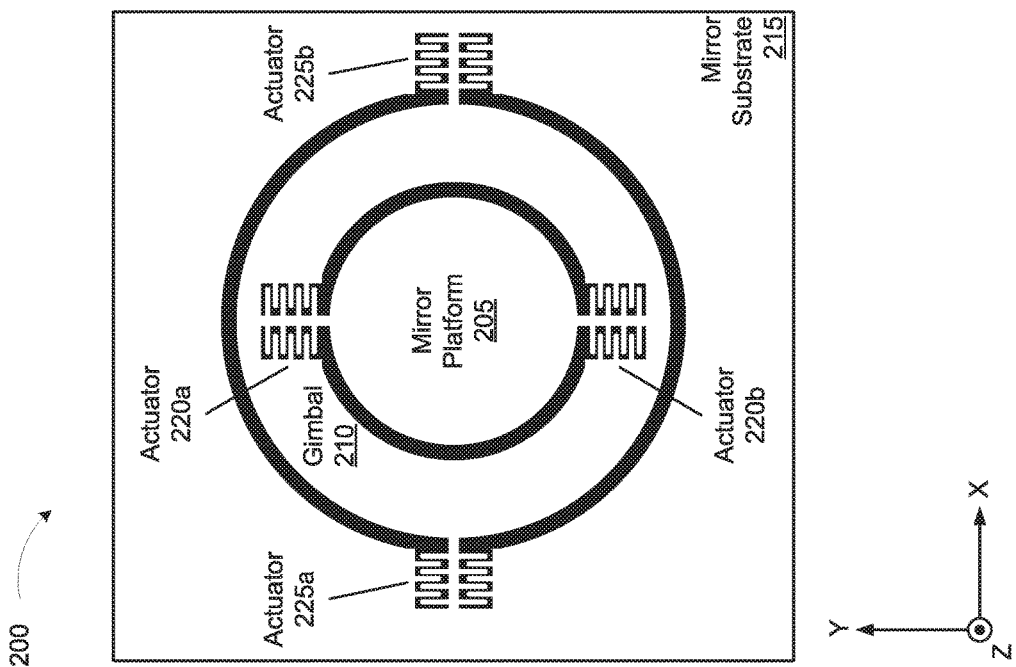
FIG. 2B is a diagram of a MEMS mirror array, according to an illustrative implementation.

FIG. 2B is a diagram of a MEMS mirror array 110, according to an illustrative implementation. The MEMS mirror array 110 can include a plurality of MEMS mirror assemblies 200a-200c (collectively "MEMS mirror assemblies 200"). In some implementations, the MEMS mirrors can be arranged in an offset grid as shown in FIG. 2B, a square grid, or a pattern of concentric circles or spirals. In some implementations, the distribution of the MEMS mirror assemblies 200 in the MEMS mirror array 110 will correspond to the configuration of the collimators 105 such that each optical signal beam entering or leaving the collimator 105 is directed to or from a corresponding MEMS mirror assembly 200 of the MEMS mirror array 110. In some implementations, the MEMS mirror array 110 can include signal traces (not shown) of copper or other conductive material carrying switching voltages to the actuators 220 and 225. The switching voltage can emanate from the controller 140 or from a digital-to-analog converter associated with the controller 140 that can convert switching commands from the controller 140 to analog voltages for actuating the MEMS mirror assemblies 200. In some implementations, the MEMS mirror array 110 can include four signal traces for each MEMS mirror assembly 200. The four signal traces can include a first signal trace carrying a voltage to the actuators 220a and 220b to move the mirror platform 205 about a first axis in a first direction, a second signal trace carrying a voltage to the actuators 220a and 220b to move the mirror platform 205 about the first axis in a second direction, a third signal trace carrying a voltage to the actuators 225a and 225b to move the mirror platform 205 and gimbal 210 about a second axis in a third direction, and a fourth signal trace carrying a voltage to the actuators 225a and 225b to move the mirror platform 205 and gimbal 210 about the second axis in a fourth direction.

In some implementations, the mirror platform 205, the gimbal 210, and the mirror substrate 215 of each MEMS mirror assembly 200 can be fabricated from a combination of the mirror substrate 215 (e.g., double silicon-on-insulator (DSOI) wafer) bonded to a base substrate (i.e., a second silicon wafer). An example method of fabricating a MEMS mirror assembly 200 is described below with respect to FIGS. 7A-7D. Example steps of a process of fabricating a MEMS mirror assembly 200 are described below with respect to FIG. 8A-8I.

Figure 3:
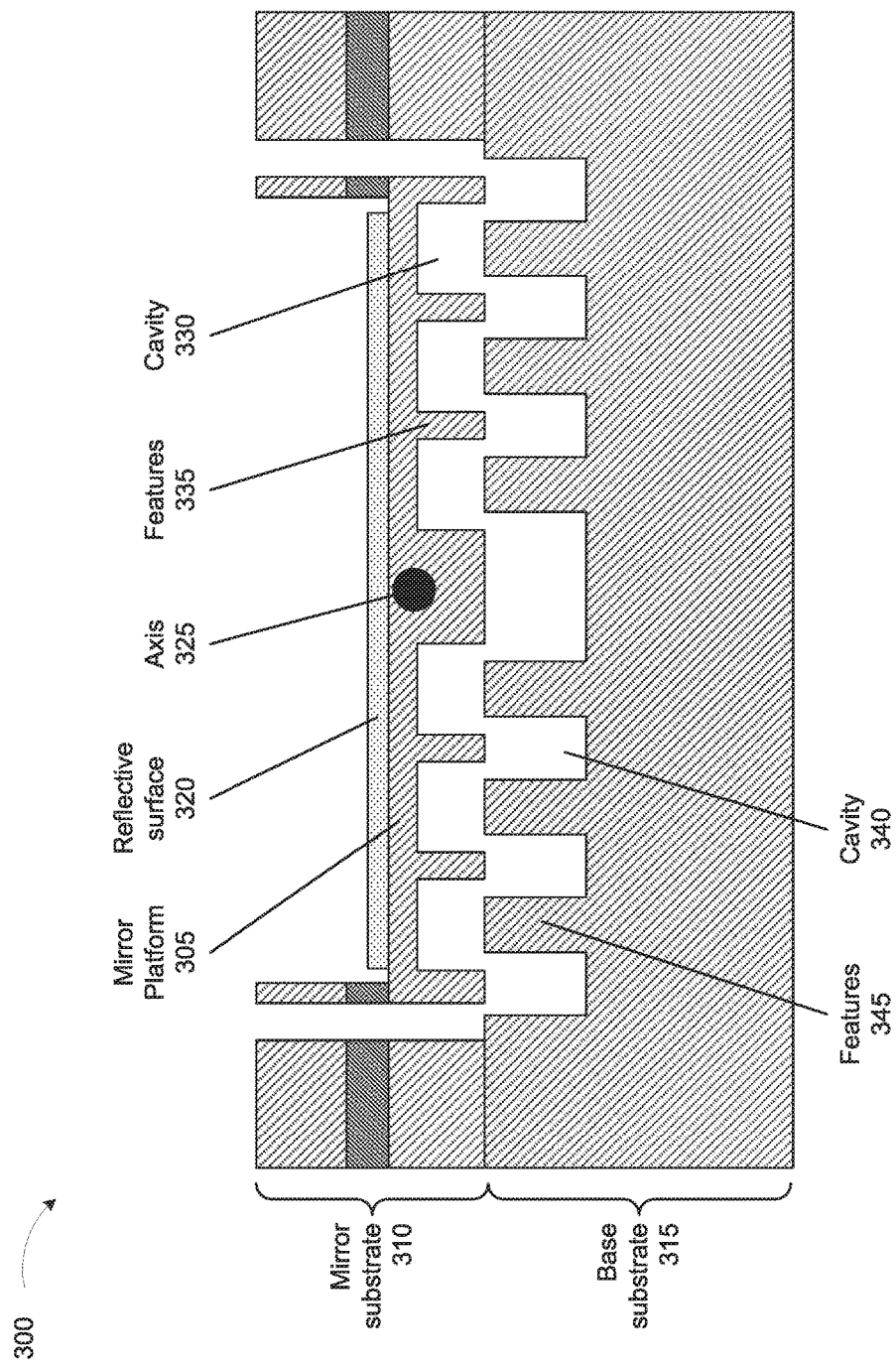
FIG. 3 is a diagram of a cross section of a MEMS mirror, according to an illustrative implementation.

FIG. 3 is a diagram of a cross section of a MEMS mirror assembly 300, according to an illustrative implementation. The MEMS mirror assembly 300 is made up of a mirror substrate 310 bonded to a base substrate 315. A mirror platform 305 is fabricated from the mirror substrate 310, and is released from the mirror substrate 310 such that it can rotate about an axis 325. The mirror platform 305 has a reflective surface 320 deposited or otherwise applied to a top surface.

The base substrate 315 defines a cavity 340 and an array of features 345 extending upwards from a bottom of the cavity 340. A bottom surface of the mirror platform 305 defines an array of cavities 330 and an array of features 335. The array of features 335 are sized, shaped, and positioned such that the array of features 345 can extend into spaces separating the array of features 335 when the mirror platform 305 moves from its rest state. In some implementations, the array of features 335 defines an array of cavities 330 into which the array of features 345 extend when the mirror platform 305 moves from its rest state. In some implementations, the array of features 345 defines an array of cavities 330 into which the array of features 335 extend when the mirror platform 305 moves from its rest state.

When the features 335 and 345 interleave, fluid between the mirror platform 305 and the base substrate 315 must push its way past the features 335 and 345. The friction of the fluid against the side surfaces of features 335 and 345 produces a shear force along the side surfaces of the features that is out of phase with the direction of actuation of the mirror platform 305. This produces a damping force. The shear force can continue damping movement of the mirror platform 305 throughout any subsequent ringing motion. A gap between the features 335 and 345 can be configured to promote the desired amount of friction while allowing enough play to prevent mechanical interference due to tolerances in fabrication and/or during rotational movement of the mirror platform 305. In some implementations, the gap can be approximately 0.1-20 µm measured between neighboring sides of features 335 and 345 in a direction parallel to a top surface of the base substrate 315 when the MEMS mirror platform 305 is in a rest state. In some implementations, the gap can be approximately 5-10 µm. The gap can vary depending on the positional state of the MEMS mirror platform 305.

In some implementations, the presence of the cavities 330 in the mirror platform 305 can reduce the rotational mass of the mirror platform 305 and thus increase the resonant frequency of the MEMS mirror assembly 300 system. The increase in resonant frequency increases the impact of the fluid damping mechanisms.

In some implementations, the mirror platform 305 can be mounted to a gimbal. The gimbal can facilitate rotational movement in two dimensions. In this configuration, the mirror platform can rotate independently from the gimbal in a first dimension, but in unison with the gimbal in a second dimension. Thus, the system can have a moment of inertia that is greater for movement in one dimension versus the other. In some implementations, the damping features can be distributed in order to provide as much damping as is practical for each dimension of rotation. In some implementations the damping features can be distributed to provide more resistance in the dimension in which the system has a greater stiffness or moment of inertia, thereby approximating equal damping in both dimensions. In some implementations, additional features can be defined into the underside of the gimbal and into the base substrate region underneath the gimbal.

Example configurations of mirror platform 305 and base substrate 315 features are described below with respect to FIG. 6A-6C.

Figure 4:
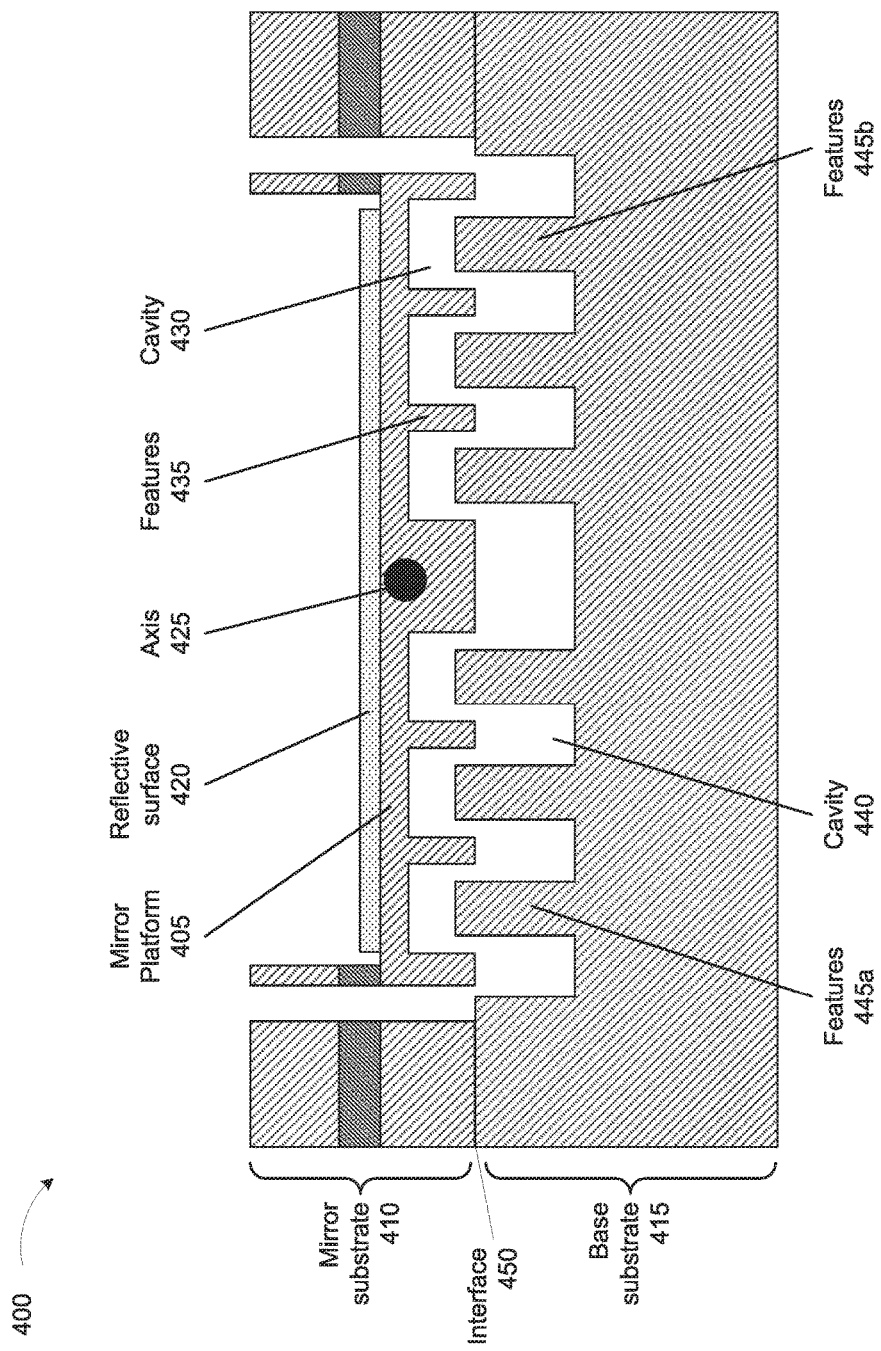
FIG. 4 is a diagram of a cross section of a MEMS mirror with mirror platform features and base substrate features that interleave when the mirror platform is at rest, according to an illustrative implementation.

FIG. 4 is a diagram of a cross section of a MEMS mirror assembly 400 with mirror platform features 435 and base substrate features 445a and 445b (collectively "base substrate features 445") that interleave when the mirror platform 405 is at rest, according to an illustrative implementation. The MEMS mirror assembly 400 is similar to the MEMS mirror assembly 300 described above, except that one or more of the mirror platform feature 435 or the base substrate features 445 are elongated relative to the interface 450 between the mirror substrate 410 and the base substrate 415. In this configuration, the MEMS mirror assembly 400 can experience more damping when the mirror platform 405 moves between positions that are close to its at-rest position.

In some implementations, the substrate features 445 can include a first subset of features 445a and a second subset of features 445b. The first subset of features 445a can extend into spaces separating the mirror platform features 435 at least when the mirror platform 405 is in a first positional state. The second subset of features 445b can extend into spaces separating the mirror platform features 435 at least when the mirror platform 405 is in a second positional state. In this manner, at least a portion of the features 445 extend into spaces separating the mirror platform features 435 in every mirror platform positional 405 state.

Figure 5:
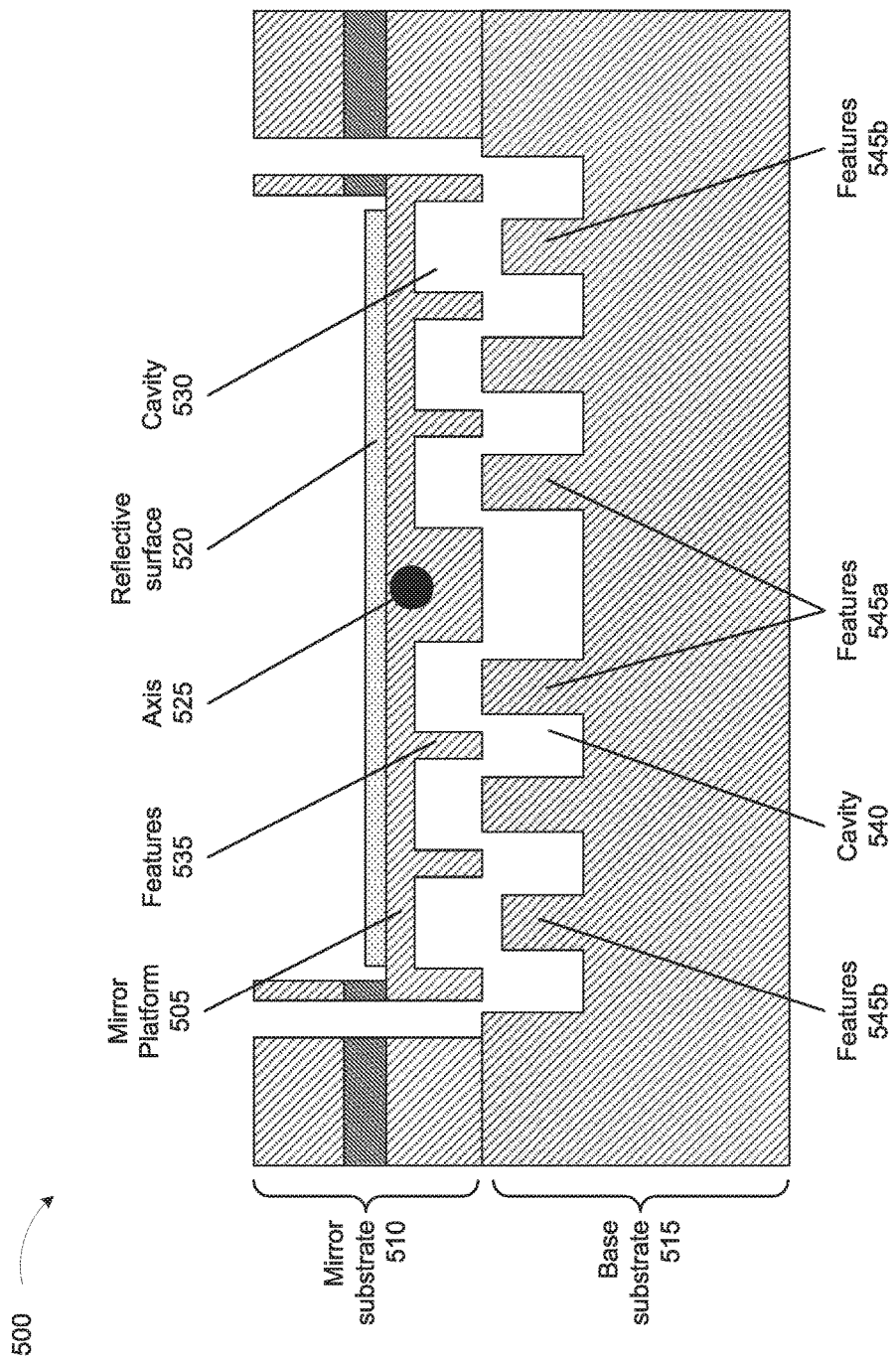
FIG. 5 is a diagram of a cross section of a MEMS mirror with base substrate features having different heights relative to a bottom of a cavity defined in the base substrate, according to an illustrative implementation.

FIG. 5 is a diagram of a cross section of a MEMS mirror assembly 500 with base substrate features 545a and 545b (collectively "features 545") having different heights relative to a bottom of a cavity 540 defined in the base substrate 515, according to an illustrative implementation. The MEMS mirror assembly 500 is similar to the MEMS mirror assembly 300 described above, except that the respective heights of features 545a and 545b relative to each other can be configured to allow a greater range of rotational movement of the mirror platform 505. In some implementations, the first subset of features 545a is located a first distance from the rotational axis 535 of the mirror platform 505, the second subset of features 545b is located a second distance greater than the first distance from the rotational axis 535 of the mirror platform 505, and the first subset of features 545a extend further upward from the bottom of the cavity 540 than the second subset of features 545b. This configuration can allow more clearance before a top of a feature 545b contacts a bottom of a cavity 530 in the mirror platform 505.

FIGS. 6A-6C are diagrams of example mirror platform 605, 635, and 665 features and base substrate 620, 650 and 680 features, according to illustrative implementations. In each diagram, the white represents areas that are recessed with respect to the view perspective, such as the bottom of a cavity, and the black represents areas of the component that are raised with respect to the view perspective, such as the top of a feature or a bottom surface of a mirror platform. In some implementations, the patterns can be reversed; for example, with protrusions on the mirror platforms 605, 635, and 665 and cavities in the base substrates 620, 650 and 680

FIG. 6A shows a diagram of an example mirror platform 605 and base substrate 620. The features of the mirror platform 605 include walls surrounding an array of triangular cavities 610. The cavities 610 extend into the bottom surface 615 of the mirror platform 605. In some implementations, the array of cavities 610 can form a close packed structure. A close pack structure of this nature allows for the removal of a relatively large amount of mass while leaving a lattice of walls that maintain the structural integrity of the mirror platform 605. This type of structure also provides a large surface area of mirror platform 605 features for interacting with base substrate 620 features.

The features of the base substrate include an array of triangular protrusions 625 extending upwards from the bottom of a cavity 630 in the base substrate 620. The protrusions 625 and the cavities 610 are configured to allow each to interleave with the other when the mirror platform 605 moves with respect to the base substrate 620. The dimensions of the cavities 610 and the protrusions 625 can be configured to generate the desired amount of damping from fluid friction while having enough clearance to allow the desired amount of movement of the mirror platform 605.

FIG. 6B shows a diagram of an example mirror platform 635 and base substrate 650. The features of the mirror platform 635 include walls surrounding an array of circular or cylindrical cavities 640. The cavities 640 extend into the bottom surface 645 of the mirror platform 635. In some implementations, the array of cavities 640 can form a close packed structure. A close pack structure of this nature allows for the removal of a relatively large amount of mass while leaving a lattice of walls that maintain the structural integrity of the mirror platform 635. This type of structure also provides a large surface area of mirror platform 635 features for interacting with base substrate 650 features.

The features of the base substrate include an array of cylindrical protrusions 655 extending upwards from the bottom of a cavity 660 in the base substrate 650. The protrusions 655 and the cavities 640 are configured to allow each to interleave with the other when the mirror platform 635 moves with respect to the base substrate 650. The dimensions of the cavities 640 and the protrusions 655 can be configured to generate the desired amount of damping from fluid friction while having enough clearance to allow the desired amount of movement of the mirror platform 635.

FIG. 6C shows a diagram of an example mirror platform 665 and base substrate 680. The features of the mirror platform 665 include walls surrounding an array of rectangular cavities 670. The cavities 670 extend into the bottom surface 675 of the mirror platform 665. In some implementations, the array of cavities 670 can form rectangles extending lengthwise in two different dimensions. This configuration can provide damping in each dimension that is approximately equivalent to damping in the other dimension. This configuration also provides a large surface area of mirror platform 665 features for interacting with base substrate 680 features.

The features of the base substrate include an array of rectangular protrusions 685 extending upwards from the bottom of a cavity 690 in the base substrate 680. The protrusions 685 and the cavities 670 are configured to allow each to interleave with the other when the mirror platform 665 moves with respect to the base substrate 680. The dimensions of the cavities 670 and the protrusions 685 can be configured to generate the desired amount of damping from fluid friction while having enough clearance to allow the desired amount of movement of the mirror platform 665.

In some implementations, the mirror platform features can form a matrix or lattice across substantially all of the bottom surface of the mirror platform 605, 635, and/or 665 except for a rim or border of fixed width. The base substrate 620, 650, and/or 680 can include base substrate features configured to interleave with the mirror platform features during rotation of the mirror platform. The base substrate 620, 650, and/or 680 may not, however, include features that interleave with any mirror platform features having irregular shape due to abutting the rim or border.

FIGS. 7A-7D are flowcharts of an example method 700 of fabricating a MEMS mirror array, and FIGS. 8A-8I show steps of an example process for fabricating a MEMS mirror array by the method 700, according to illustrative implementations. The method 700 is described below with reference to, and simultaneously with, the fabrication steps of FIGS. 8A-8I. The method 700 includes providing a base substrate defining an array of cavities, each cavity having a plurality of first features extending upwards from a bottom of the cavity (stage 710). The method 700 includes providing a mirror substrate defining an array of MEMS actuators and MEMS mirror platforms, wherein each MEMS mirror platform defines a plurality of second features on a first side of the MEMS mirror platform that are sized, shaped, and positioned such that the plurality of second features can fit into spaces separating the plurality of first features extending up from a corresponding cavity in the base substrate (stage 720). The method 700 includes coupling the mirror substrate to the base substrate such that the first side of each MEMS mirror platforms faces a corresponding cavity in the base substrate and activation of each MEMS actuator moves the corresponding MEMS mirror platform from a first positional state to a second positional state, wherein the plurality of second features extend into spaces separating the plurality of first features in the second positional state (stage 730). The method 700 includes providing a reflective material disposed on a second side of each MEMS mirror platform opposite the first side of the MEMS mirror platform (stage 740). In some implementations, the method 700 can include providing conductive traces on the mirror substrate for the purpose of supplying actuation voltages to the actuators of each MEMS mirror assembly of the MEMS mirror array (stage 750).

Figure 7A:
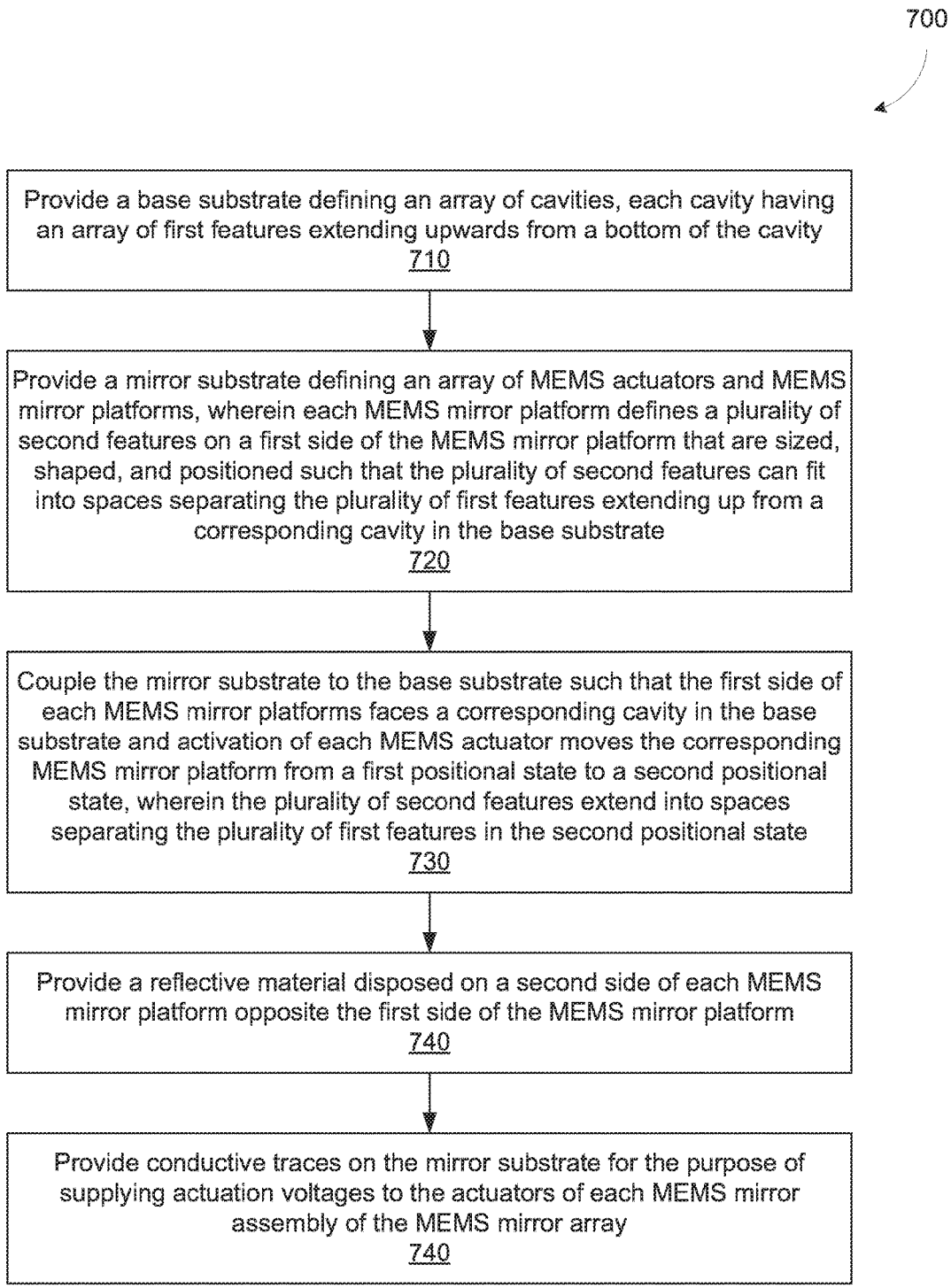
FIGS. 7A-7D are flowcharts of example methods of fabricating a MEMS mirror array, according to illustrative implementations.
Figure 7B:
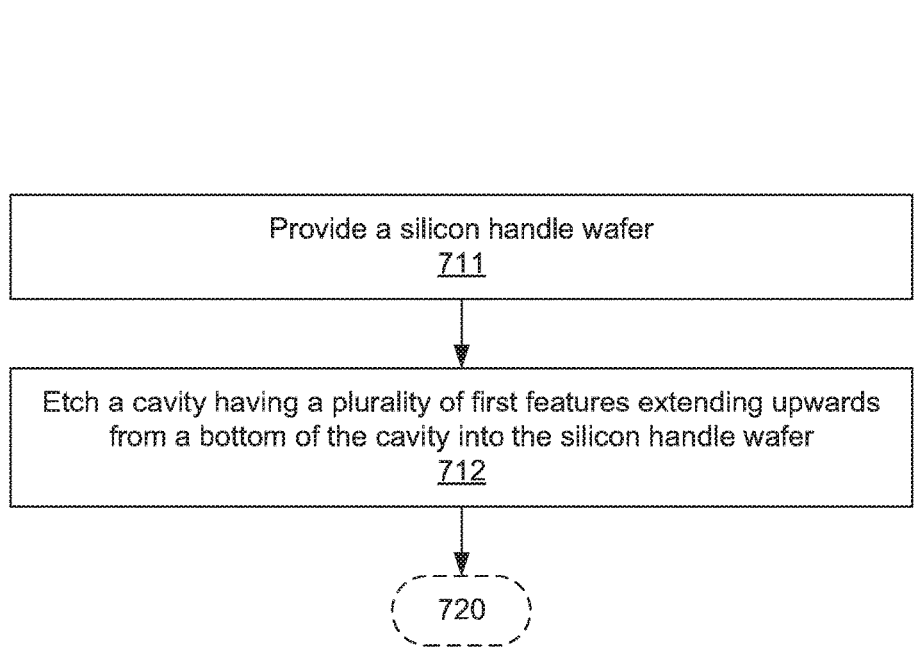
Figure 8A:
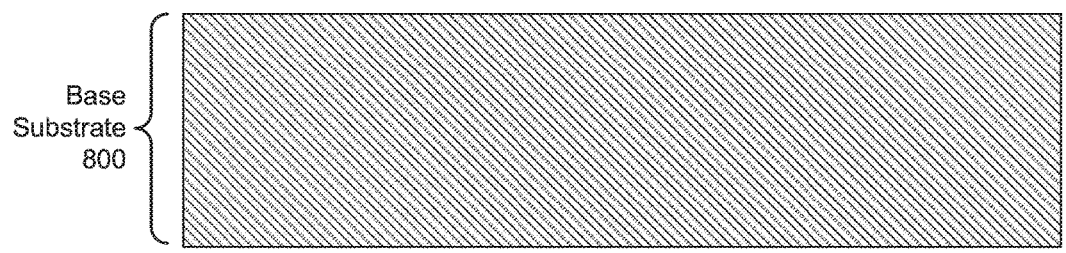
FIGS. 8A-8I show steps of an example process for fabricating a MEMS mirror array, according to an illustrative implementation.
Figure 8B:
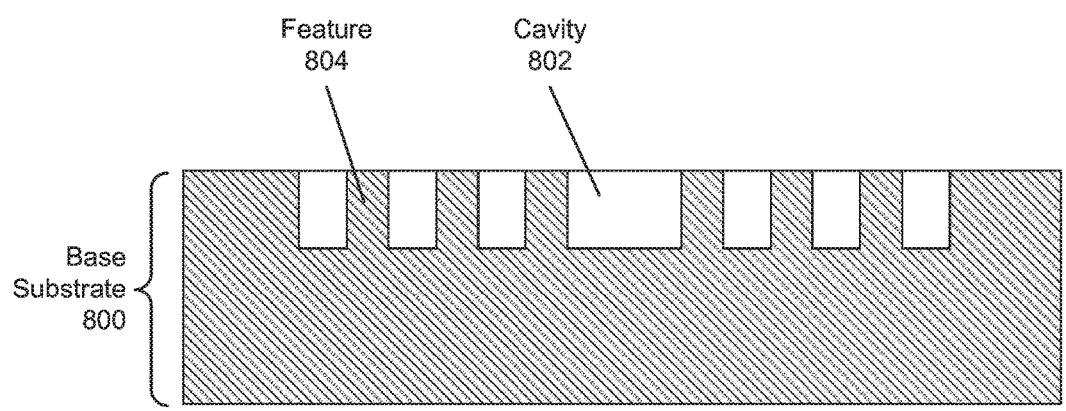

The method 700 includes providing a base substrate defining an array of cavities, each cavity having a plurality of first features extending upwards from a bottom of the cavity (stage 710). The base substrate can have a configuration similar to one or a combination of the base substrates 315, 415, 515, 620, 650, and/or 680 shown in FIGS. 3, 4, 5, 6A, 6B, and 6C, respectively. In some implementations, stage 710 can include the additional stages shown in FIG. 7B. As shown in FIG. 7B, stage 710 can include providing a base substrate 800 as shown in FIG. 8A (stage 711). Stage 710 can include etching a cavity 802 into the base substrate 800 (stage 712). The cavity 802 is etched to leave an array of first features 804 extending upwards from a bottom of the cavity 802 as shown in FIG. 8B. In some implementations, the etching process can include a deep reactive-ion etching (DRIE) process. In some implementations, the height of the features 804 is such that they will interleave with features of a mirror substrate when the mirror substrate is in an at-rest position, such as in the base substrate 415 described above with respect to FIG. 4. In some implementations, the heightened features 804 can be fabricated by adding another layer in the bottom SOI stack, and then using an etch process that stops below this layer for regions other than the heightened features 804. In some implementations, a potassium hydroxide or tetramethylammonium hydroxide etch can be used to form a series of steps that become the heightened features 804 that can interleave with the features of the mirror substrate. In some implementations, the base substrate 800 can be etched such that some of the features 804 have different heights, such as in the base substrate 515 described above with respect to FIG. 5. In some implementations, the height differential among the features 804 can be created by performing one or more additional etching steps during which only a subset of the features 804 is masked.

Figure 7C:
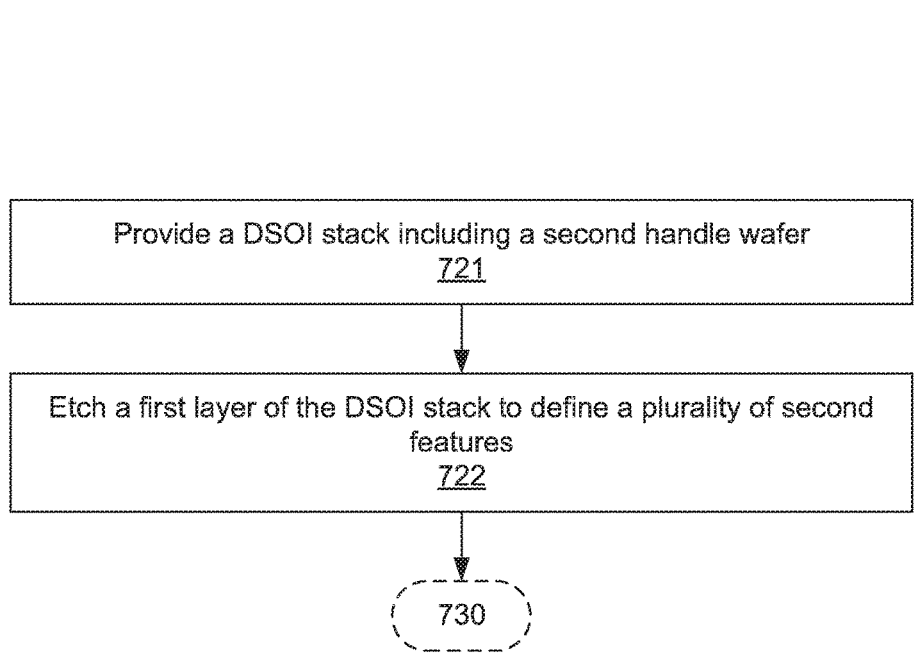
Figure 7D:
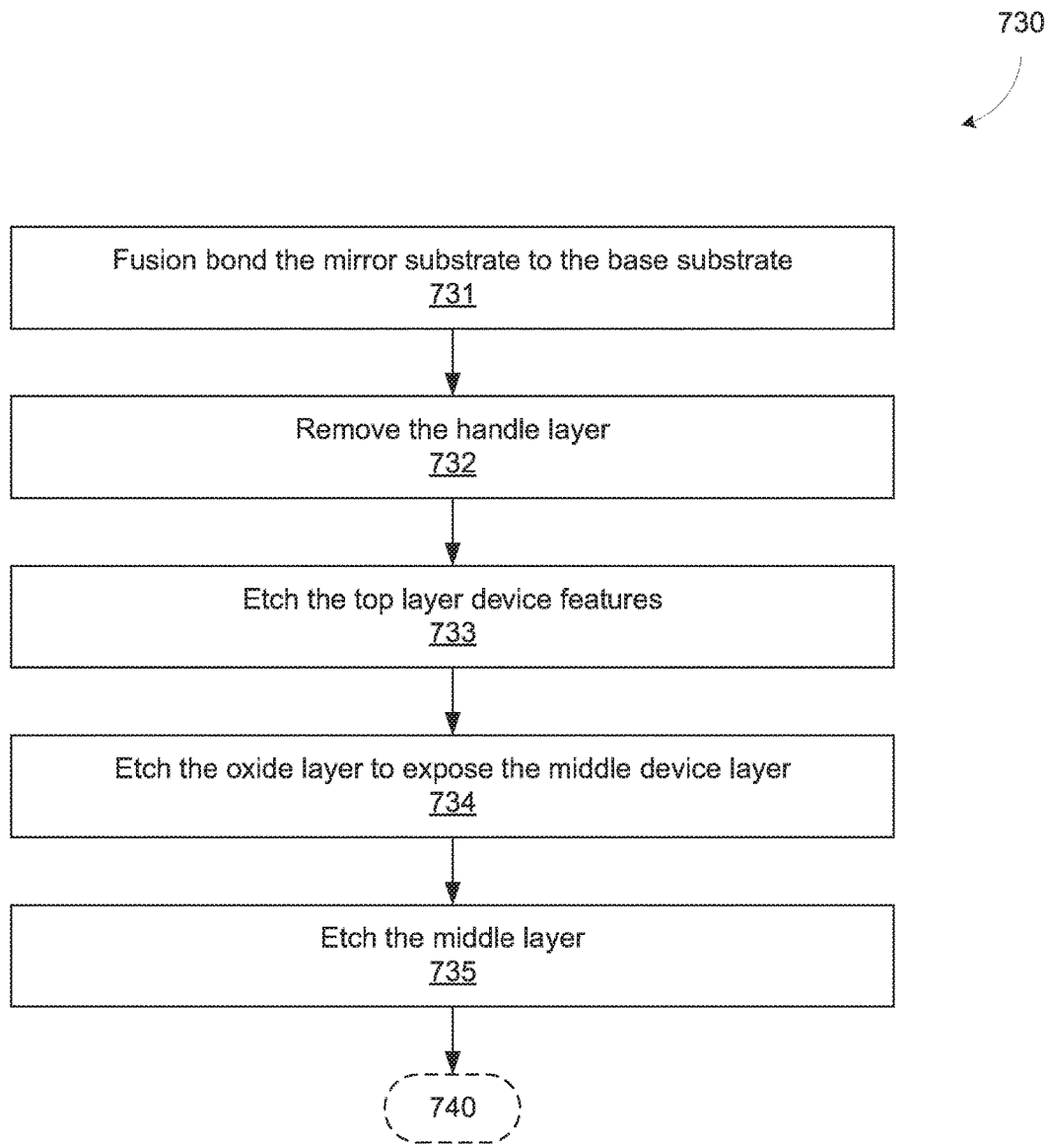
Figure 8C:
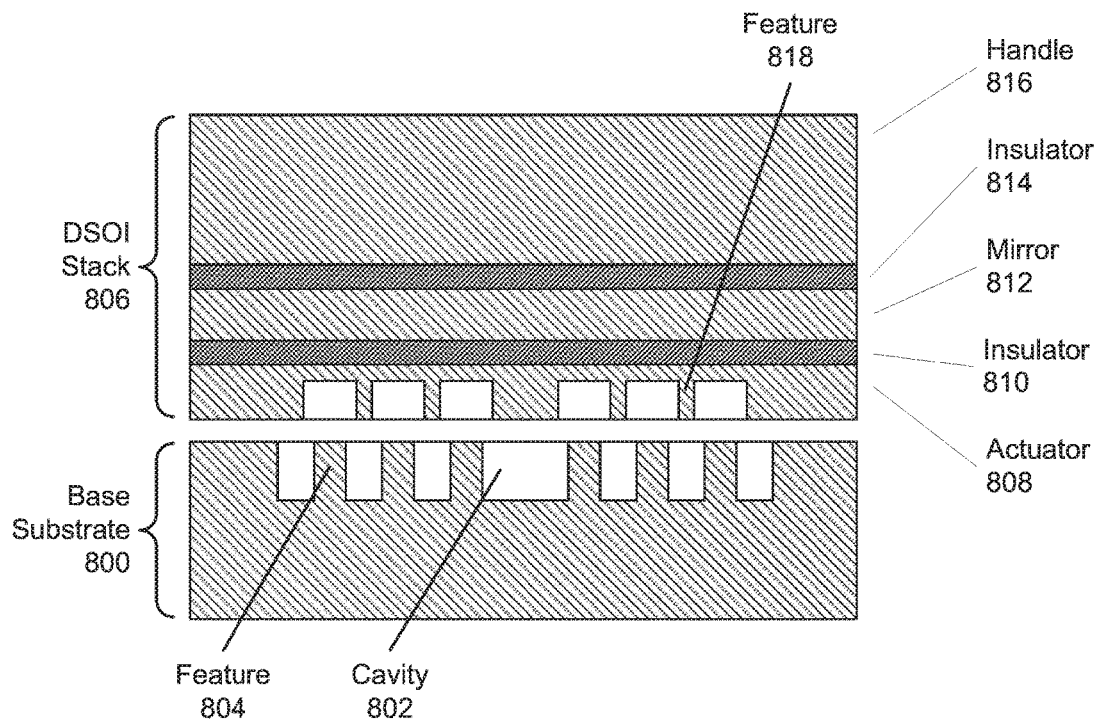

The method 700 includes providing a mirror substrate defining an array of MEMS actuators and MEMS mirror platforms, wherein each MEMS mirror platform defines a plurality of second features on a first side of the MEMS mirror platform that are sized, shaped, and positioned such that the plurality of second features can fit into spaces separating the plurality of first features extending up from a corresponding cavity in the base substrate (stage 720). The mirror substrate can have a configuration similar to one or more of the mirror substrates 310, 410, and/or 510 shown in FIGS. 3, 4, and 5, respectively, and have a mirror platform having a configuration similar to one or a combination of the mirror platforms 305, 405, 505, 605, 635, and/or 665 shown in FIGS. 3, 4, 5, 6A, 6B, and 6C, respectively. In some implementations, stage 720 can include the additional stages shown in FIG. 7C. As shown in FIG. 7C, stage 720 can include providing a double silicon-on-insulator (DSOI) stack 806 including a handle layer 816 as shown in FIG. 8C (stage 721). The DSOI stack 806 can include several layers, including an actuator layer 808, a first insulator layer 810, a mirror layer 812, a second insulator layer 814, and a handle layer 816. In some implementations, the actuator layer 808, the mirror layer 812, and the handle layer 816 can include silicon. The silicon of these layers can be intrinsic or doped, crystalline or amorphous. In some implementations, the handle layer 816 can include glass. In some implementations, the insulator layers 810 and 814 can be a silicon oxide or other dielectric oxide. In some implementations, the insulator layers 810 and 814 can include organic or polymer materials such as polyimide, kapton, or a resist. Stage 720 can include etching the actuator layer 808 of the DSOI stack 806 to define the array of second features 818 (stage 722). In some implementations, the second features 818 can include one or a combination of the features and/or cavities of the mirror platforms 305, 405, 505, 605, 635, and/or 665. In some implementations, the etching stage 722 can include additional steps to increase or reduce the height of some or all of the features 818.

Figure 8D:
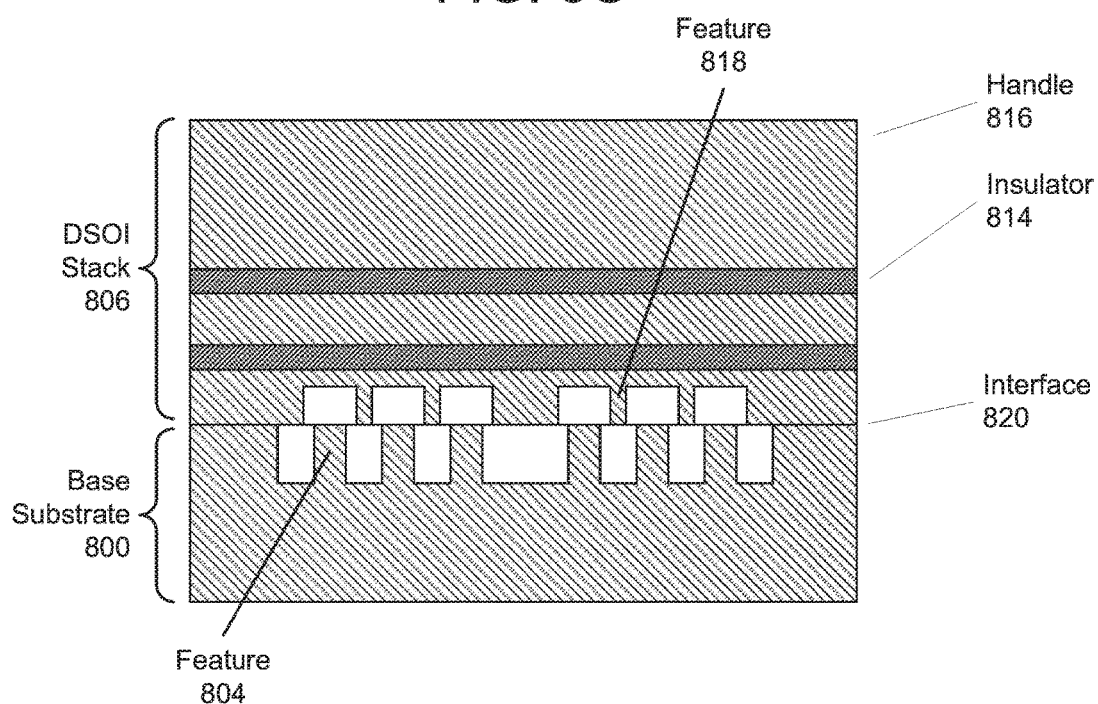
Figure 8E:
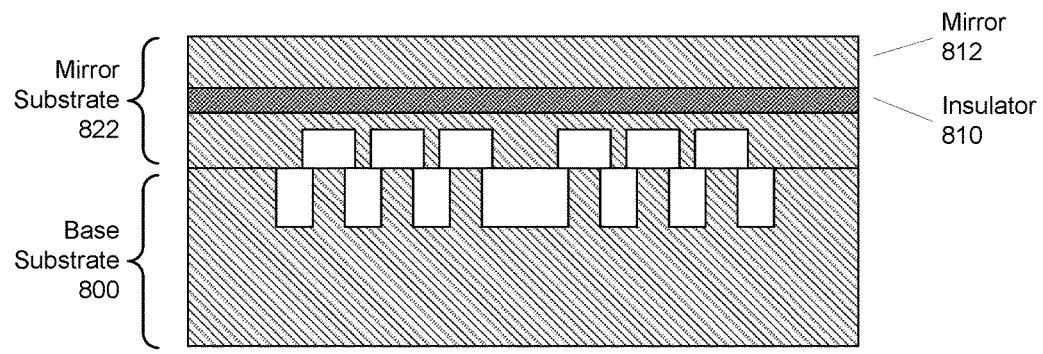
Figure 8F:
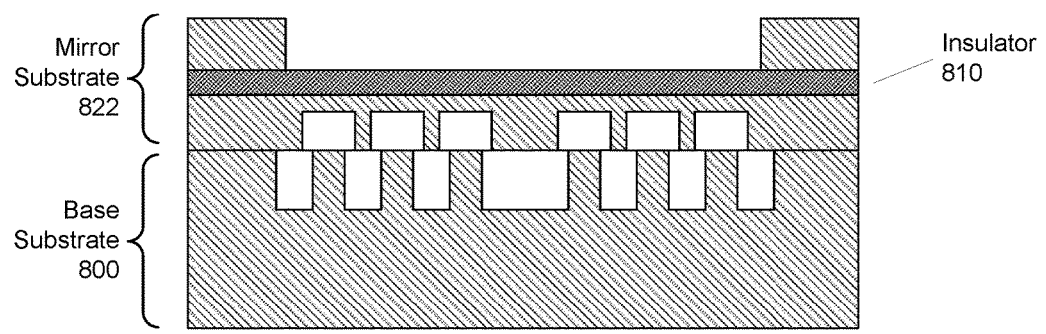
Figure 8G:
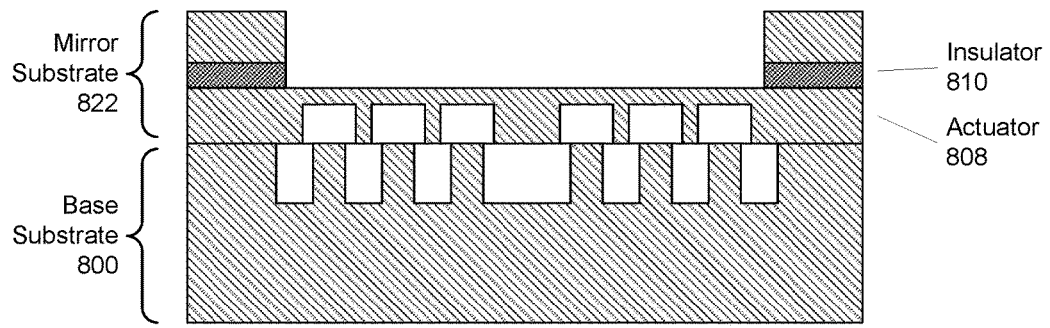
Figure 8H:
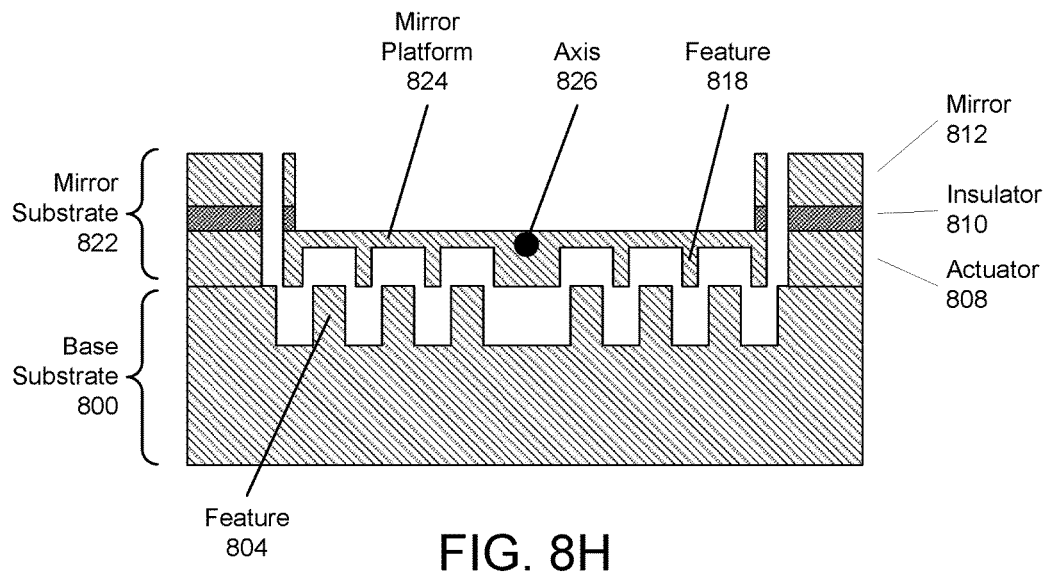

The method 700 includes coupling the mirror substrate to the base substrate such that the first side of each MEMS mirror platforms faces a corresponding cavity in the base substrate and activation of each MEMS actuator moves the corresponding MEMS mirror platform from a first positional state to a second positional state, wherein the plurality of second features extend into spaces separating the plurality of first features in the second positional state (stage 730). In some implementations, stage 730 can include the additional stages shown in FIG. 7D. As shown in FIG. 7C, stage 730 can include fusion bonding the DSOI stack 806 including the mirror substrate to the base substrate 800 including base substrate as shown in FIG. 8D (stage 731). The DSOI stack 806 and the base substrate 800 are bonded such that the features 804 are aligned with the spaces in between the features 818. In some implementations, a process of silicon-silicon fusion or plasma-initiated bonding can be used to create a bond between the DSOI stack 806 and the base substrate 800 at the interface 820. In some implementations, anodic bonding can be used to bond substrate materials other than silicon. Stage 730 can include removing the handle layer 816 and the second insulator layer 814 as shown in FIG. 8E (stage 732). Removing the handle layer 816 and the second insulator layer 814 exposes the mirror layer 812 and leaves the mirror substrate 822 still bonded to the base substrate 800. In some implementations, the handle layer 816 and the second insulator layer 814 are removed using one or more etching steps. In some implementations, the handle layer 816 and the second insulator layer 814 are removed using one or more machining or planing steps. In some implementations, a combination or series of multiple processes can be used to remove these layers. For example, a grind and polishing operation could reduce the layer to a thickness that can be more easily etched with a wet potassium hydroxide or tetramethylammonium hydroxide process. The advantage of this multi-stage process is that it can be used on multiple wafers simultaneously. In some implementations, a DRIE-based process could be used. A DRIE process, however, may only be practical to implement on a single wafer at a time. Stage 730 can include etching the top layer device features as shown in FIG. 8F (stage 733). This stage exposes the first insulator layer 810 and begins the process of releasing portions of the actuators, gimbal, and mirror platform. Stage 730 can include includes etching the first insulator layer 810 to expose the actuator layer 808 as shown in FIG. 8G (stage 734). Stage 730 can include includes etching through the mirror layer 812, the first insulator layer 810, and the actuator layer 808 around the mirror platform 824 as shown in FIG. 8H (stage 735). This stage can complete the release of the actuators, gimbal, and mirror platform 824. In some implementations, the mirror platform 824, when released, is free to rotate about an axis 826. When the mirror platform 824 rotates about the axis 826, the features 804 can fit into spaces separating the features 818 to bring about the desired damping of the mirror platform's 824 movement.

Figure 8I:
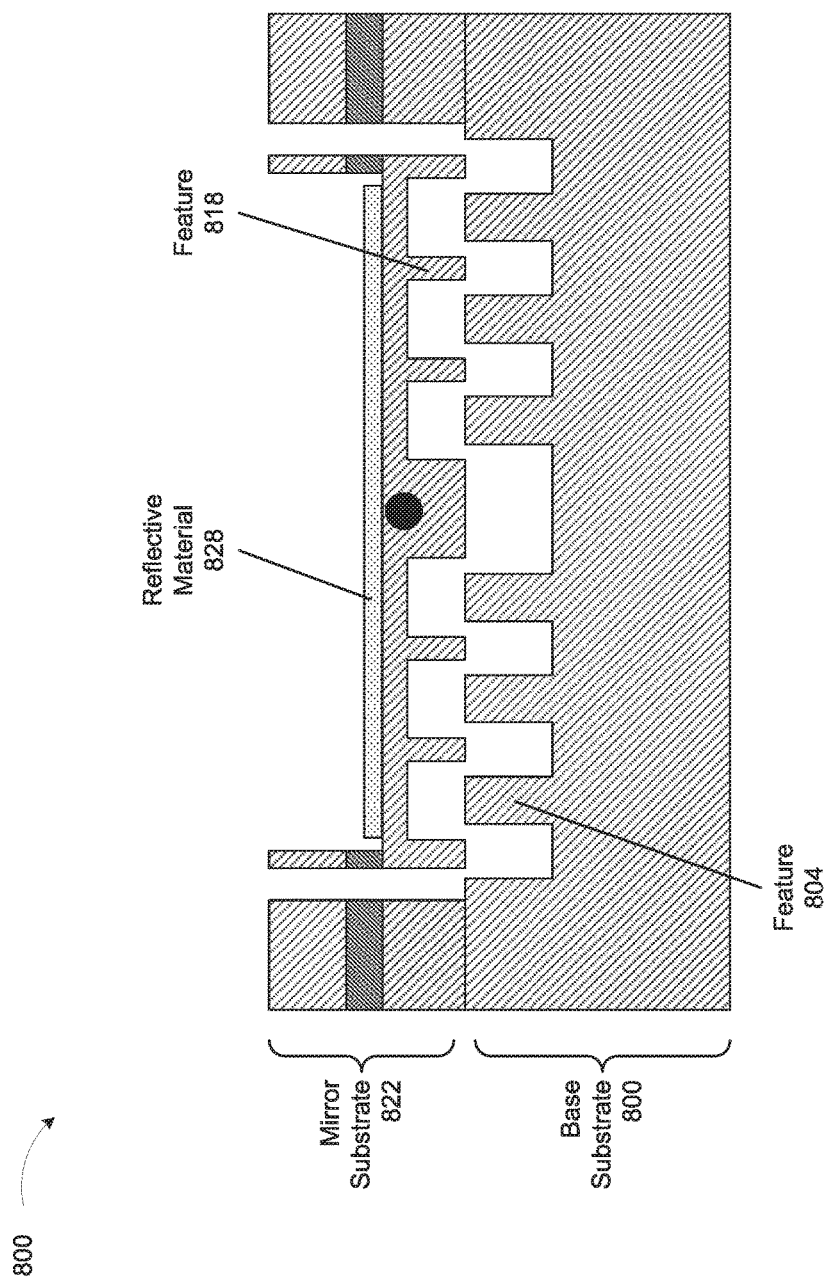

The method 700 includes providing a reflective material 828 disposed on a second side of each MEMS mirror platform 824 opposite the first side of the MEMS mirror platform as shown in FIG. 8I (stage 740). In some implementations, the reflective material 828 can include a pure metal or alloy including gold, nickel, aluminum, chromium, titanium, or some combination thereof. In some implementations, the reflective material 828 can include a dielectric-based film tuned to reflect one or more target wavelengths. The reflective material 828 can be deposited or applied using sputtering, thin-film, or thick-film deposition techniques.

In some implementations, the method 700 can include providing conductive traces on the mirror substrate for the purpose of supplying actuation voltages to the actuators of each MEMS mirror assembly of the MEMS mirror array (stage 750). Each MEMS actuator can have a first part and a second part. The method 700 can include providing a plurality of first conductive traces on the mirror substrate. Each first conductive trace can be configured to convey a first actuation voltage to a corresponding first part of the MEMS actuator to move a corresponding MEMS mirror platform in a first direction. The method 700 can include providing a plurality of second conductive traces on the mirror substrate. Each second conductive trace can be configured to convey a second actuation voltage to a corresponding second part of the MEMS actuator to move the corresponding MEMS mirror platform in a second direction opposite the first direction.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A microelectromechanical system (MEMS) mirror assembly comprising:
   a base substrate defining a cavity and a plurality of first features extending upwards from a bottom of the cavity;
   a mirror substrate coupled to the base substrate and defining a MEMS mirror platform and a MEMS actuator coupled to a periphery of the MEMS mirror platform and suspending the MEMS mirror platform over the base substrate, wherein actuation of the MEMS actuator moves the MEMS mirror platform from a first positional state to a second positional state, and the MEMS mirror platform defines a plurality of second features on a side of the MEMS mirror platform facing the base substrate that are sized, shaped, and positioned such that the plurality of second features extend into spaces separating the plurality of first features when the mirror platform is in the second positional state; and
   a reflective material disposed on a side of the MEMS mirror platform facing away from the base substrate.

2. The MEMS mirror assembly of claim 1, wherein:
   the MEMS actuator rotates the MEMS mirror platform about an axis to achieve the first positional state and the second positional state.

3. The MEMS mirror assembly of claim 1, wherein:
   the plurality of second features form a plurality of walls that define openings into which fewer than all of the plurality of first features extend when the MEMS mirror platform is in the second positional state.

4. The MEMS mirror assembly of claim 3, wherein:
   the mirror platform moves from the first positional state to the second positional state by rotating about an axis,
   the plurality of first features include a first subset of features located a first distance from the axis and a second subset of features located a second distance from the axis greater than the first distance, and
   the first subset of features extend further from the bottom of the cavity than the second subset of features.

5. The MEMS mirror assembly of claim 1, wherein:
   the plurality of first features extend to a height that is greater than a depth of the cavity.

6. The MEMS mirror assembly of claim 1, wherein:
   a first subset of the first plurality of features extend into spaces separating a first subset of the second plurality of features when the mirror platform is in the first positional state; and a second subset of the first plurality of features extend into spaces separating a second subset of the second plurality of features when the mirror platform is in the second positional state.

7. The MEMS mirror assembly of claim 1, comprising:
a fluid surrounding the mirror platform, the plurality of first features, and the plurality of second features, wherein:
a gap between the plurality of first features and the plurality of second features is between 5 and 10 µm measured in a direction parallel to a top surface of the base substrate when the MEMS mirror platform is in a rest state.

8. The MEMS mirror assembly of claim 1, wherein:
the actuator is a vertical comb drive actuator.

9. The MEMS mirror assembly of claim 1, wherein:
the MEMS actuator has a first part and a second part,
a first voltage applied across the first part of the MEMS actuator moves the MEMS mirror platform in a first direction, and
a second voltage applied across the second part of the MEMS actuator moves the MEMS mirror platform in a second direction opposite the first direction.

10. The MEMS mirror assembly of claim 1, wherein:
the mirror substrate defines a gimbal positioned above the cavity, the gimbal defining a second MEMS actuator and a cutout containing the MEMS mirror platform;
actuation of the MEMS actuator rotates the MEMS mirror platform about a first axis; and
actuation of the second MEMS actuator rotates the gimbal and the MEMS mirror platform about a second axis substantially orthogonal to the first axis.

11. A method of manufacturing a microelectromechanical system (MEMS) mirror array comprising:
providing a base substrate defining an array of cavities, each cavity having a plurality of first features extending upwards from a bottom of the cavity;
providing a mirror substrate defining an array of MEMS mirror platforms and an array of MEMS actuators, each MEMS actuator coupled to a periphery of a MEMS mirror platform and suspending the MEMS mirror platform over the base substrate, wherein each MEMS mirror platform defines a plurality of second features on a first side of the MEMS mirror platform that are sized, shaped, and positioned such that the plurality of second features can fit into spaces separating the plurality of first features extending up from a corresponding cavity in the base substrate;
coupling the mirror substrate to the base substrate such that the first side of each MEMS mirror platform faces a corresponding cavity in the base substrate and activation of each MEMS actuator moves the corresponding MEMS mirror platform from a first positional state to a second positional state, wherein the plurality of second features extend into spaces separating the plurality of first features in the second positional state; and
providing a reflective material disposed on a second side of each MEMS mirror platform opposite the first side of the MEMS mirror platform.

12. The method of claim 11, wherein:
each MEMS actuator is configured to rotate a corresponding MEMS mirror platform about an axis to achieve the first positional state and the second positional state.

13. The method of claim 11, wherein:
the plurality of second features form a plurality of walls that define openings into which fewer than all of the plurality of first features extend when each MEMS mirror platform is in the second positional state.

14. The method of claim 13, wherein:
each MEMS mirror platform is configured to move from the first positional state to the second positional state by rotating about an axis,
the plurality of first features include a first subset of features located a first distance from the axis and a second subset of features located a second distance from the axis greater than the first distance, and
the first subset of features extend further from the bottom of the cavity than the second subset of features.

15. The method of claim 11, wherein:
the plurality of first features extend to a height that is greater than a depth of the cavity.

16. The method of claim 11, wherein:
a first subset of the first plurality of features extend into spaces separating a first subset of the second plurality of features when each MEMS mirror platform is in the first positional state; and
a second subset of the first plurality of features extend into spaces separating a second subset of the second plurality of features when each MEMS mirror platform is in the second positional state.

17. The method of claim 11, comprising:
providing a fluid surrounding each MEMS mirror platform, the plurality of first features, and the plurality of second features, wherein:
a gap between the plurality of first features and the plurality of second features is between 5 and 10 µm measured in a direction parallel to a top surface of the base substrate when the MEMS mirror platform is in a rest state.

18. The method of claim 11, wherein:
each MEMS actuator is a vertical comb drive actuator.

19. The method of claim 11, wherein each MEMS actuator has a first part and a second part, the method comprising:
providing a plurality of first conductive traces on the mirror substrate, each first conductive trace configured to convey a first actuation voltage to a corresponding first part of the MEMS actuator to move a corresponding MEMS mirror platform in a first direction, and
providing a plurality of second conductive traces on the mirror substrate, each second conductive trace configured to convey a second actuation voltage to a corresponding second part of the MEMS actuator to move the corresponding MEMS mirror platform in a second direction opposite the first direction.

20. The method of claim 11, wherein:
the mirror substrate defines an array of gimbals positioned above the cavities, each gimbal defining a second MEMS actuator and a cutout containing a corresponding MEMS mirror platform of the array of MEMS mirror platforms;
actuation of each MEMS actuator rotates the corresponding MEMS mirror platform about a first axis; and
actuation of each second MEMS actuator rotates the corresponding gimbal and MEMS mirror platform about a second axis substantially orthogonal to the first axis.

* * * * *